(12) United States Patent
Park et al.

(10) Patent No.: US 6,824,127 B2
(45) Date of Patent: Nov. 30, 2004

(54) THIMBLE-TYPE STREAM INJECTION HUMIDIFIER AND QUICK RESPONSE STEAM GENERATOR

(75) Inventors: Byung-Kyu Park, Seoul (KR); Soo-Yong Cho, Jinjoo-Si (KR); Chong-Pil Kim, Goyang-Si (KR); Hae-Ryong Cheon, Seoul (KR); Joon-Sik Lee, Seoul (KR)

(73) Assignee: Korea Institute of Machinery & Materials, Daejeon-si (JP)

( * ) Notice: Subject to any disclaimer, the term of this patent is extended or adjusted under 35 U.S.C. 154(b) by 14 days.

(21) Appl. No.: 10/092,974

(22) Filed: Mar. 8, 2002

(65) Prior Publication Data

US 2002/0163092 A1 Nov. 7, 2002

(30) Foreign Application Priority Data

May 2, 2001 (KR) ........................................ 2001-23787

(51) Int. Cl.[7] ................................................ B01F 3/04
(52) U.S. Cl. ............................... 261/118; 261/DIG. 15; 261/DIG. 76; 239/550; 239/600
(58) Field of Search ................................. 261/115, 117, 261/118, DIG. 15, DIG. 76; 239/550, 600

(56) References Cited

U.S. PATENT DOCUMENTS

| | | | | |
|---|---|---|---|---|
| 2,687,614 A | * | 8/1954 | Goddard | ................... 60/39.77 |
| 3,857,514 A | * | 12/1974 | Clifton | ....................... 239/132 |
| 4,980,099 A | * | 12/1990 | Myers et al. | ............... 261/116 |
| 5,126,080 A | * | 6/1992 | Morton et al. | ............. 261/118 |
| 5,277,849 A | * | 1/1994 | Morton et al. | ............. 261/118 |
| 5,376,312 A | * | 12/1994 | Morton et al. | ............. 261/118 |
| 5,543,090 A | * | 8/1996 | Morton et al. | ............. 261/118 |

* cited by examiner

Primary Examiner—Scott Bushey
(74) Attorney, Agent, or Firm—Arent Fox

(57) ABSTRACT

A humidifier and quick response steam generator for supplying steam to the humidifier in a humidification system is disclosed. The humidifier has a modified geometry to reduce resistance, and is multi-passage structured to uniformly arrange humidifying nozzles in an air flowing duct so that absorption length can be shortened by improved mixing, thereby enhancing humidification capability and allowing humidifying tubes to change in number. The humidifying tubes can be easily detached from humidifying steam headers for replacement allowing the number of the humidifying tubes to be adjusted according to humidifying capacity, and can be designed as thimble tubes so that pneumatic pressure loss due to installation of the humidifying system can be reduced and steam of very uniform temperature can be supplied to air flow, thereby obtaining an air flow of uniform temperature and humidity.

4 Claims, 21 Drawing Sheets

THIMBLE-TYPE STREAM INJECTION HUMIDIFIER AND QUICK RESPONSE STEAM GENERATOR

BACKGROUND OF THE INVENTION

1. Field of the Invention

The present invention relates generally to a humidifier and quick response steam generator for supplying steam to the humidifier in a humidification system. More particularly, the humidifier has humidifying tubes, which can be easily detached from humidifying steam headers for replacement allowing the number of the humidifying tubes to be adjusted according to humidifying capacity, and which can be designed as thimble tubes so that pneumatic pressure loss due to installation of the humidifying system can be reduced and steam of very uniform temperature can be supplied to an air flow, thereby obtaining an air flow of uniform temperature and humidity.

2. Description of the Prior Art

As well known to those skilled in the art, strict humidity management is frequently required to be performed within a very small variation range in a manufacturing process of various experimental apparatuses or precise high-tech products. This humidity management requires quick response and high stability.

In general, humidifiers are classified into steam injection humidifiers, water spray humidifiers and evaporation humidifiers according to humidification mechanism. The steam injection humidifiers are widely used in the precision industry, and classified into an electric heating humidifier, electrode humidifier, infrared humidifier and superheated vapor-type humidifier according to the basic structure.

In the humidifiers, humidifying tubes have great influence on the uniformity of injected steam and the mixing of injected steam with the ambient air, and determine absorbing length of the whole humidification system and performance of the humidifier. In general, a fixed multi-passage quick response humidification system has humidifying tubes, which are shaped as a simple cylindrical tube and have short absorbing length and poor humidification performance. Also, in the humidifying tubes of the fixed multi-passage quick response humidification system, it is difficult to adjust the amount of sprayed steam according to variation of humidifying capacity since spraying capacity is fixed.

Also, a pan-type steam generator of the prior art has a structure in which only a heater is submerged into water. Thus, a very long time period is elapsed before steam is generated after water is heated, so that quick response steam generation cannot be performed when necessary.

SUMMARY OF THE INVENTION

Accordingly, the present invention has been made keeping in mind the above problems occurring in the fixed multi-passage humidification system of the prior art, and an object of the present invention is to provide a humidifier which has a modified geometry to reduce pneumatic resistance and has a multi-passage structure to uniformly arrange humidifying nozzles in an air flowing duct so that absorption length can be shortened by improved mixing, thereby enhancing humidification capability and enabling humidifying tubes to be replaced.

It is another object of the invention to provide a steam generator enhanced in responsiveness for supplying steam to the humidifier.

In order to accomplish the above object, the present invention provides a thimble-type steam injection humidifier in a high response humidification system, the steam injection humidifier comprising: a number of humidifying tubes structured of multi-passage modules, whereby flexibility of application can be enhanced according to humidifying capacity required for the high response humidification system; headers arranged upstream and downstream of the humidifying tubes; and detachable fastening means for fastening the humidifying tubes with the upstream and downstream headers, whereby the passages can be opened/shut according to humidifying capacity.

The steam injection humidifier may further comprise humidifying nozzles uniformly arranged in an air flowing duct, wherein the humidifying tubes are formed to have a geometric sectional shape selected from a group including flat tube, ellipse and diamond to reduce resistance against an air flow.

The humidifying nozzles may be uniformly arranged in the section of the air flowing duct, and wherein the humidifying nozzles in one of the humidifying tubes alternate with the humidifying nozzles in the adjacent one of the humidifying tubes, whereby steam is uniformly injected to an ambient air flowing section and finely mixed.

Each of the humidifying nozzles may have a hole which is tapered at an angle v of $-60°$ to $+60°$.

Each of the injection nozzles in each of the humidifying tubes may be provided as a pressed pin type nozzle that is made through elasto-plastic deformation, or a screw type nozzle having a hole formed in a round-head plus screw.

Each of the humidifying nozzles may be inwardly projected into each of the humidifying tubes so that condensate is downwardly exhausted to prevent condensate from being injected while being mixed with steam even if condensate is generated as steam is cooled by the ambient air.

Each of the humidifying tubes may comprise a pneumatic resistance adjustment tube projected to the upstream and downstream headers to allow adjustment of steam capacity introduced to the each humidifying tube, and wherein the each humidifying tube is rotatable to adjust the direction of injecting steam and the number of humidifying holes of the humidifying nozzles.

The humidifying nozzles in the each humidifying tube can be detached and replaced with sealing bodies to allow adjustment of the number of the humidifying holes.

One of the pneumatic resistance adjustment tubes of the each humidifying tube projected to the upstream header may have variable penetrating depth into the upstream header to adjust pneumatic resistance to the each humidifying tube from the upstream header to the each humidifying tube for the uniform distribution of flow rate, and tapered in the upper part, whereby flowing rate of steam into the each humidifying tube at the inlet side can be adjusted by the rotation of the tapered surface.

The tapered upper surface of the one pneumatic resistance adjustment tube may have an angle $\beta$ of $-60°$ to $+60°$.

Each of the humidifying tubes may have one end coupled with the downstream header and perpendicularly formed where a support baffle plate and an opening adjustment plate are inserted for easy adjustment of condensate and steam exhaust, and the support baffle plate perforated with a number of holes and the opening adjustment plate are combined to adjust rate of steam injected by pressure drop.

Each of the fastening means for each of humidifying tubes and the upstream header includes: a pneumatic resistance adjustment tube having threads formed in the lower periphery and a radially tapered portion formed at the lower end; a ferrule; and a nut fitted around the each humidifying tube for fixing the each humidifying tube, wherein the pneumatic resistance adjustment tube is coupled with the upstream header through welding, the each humidifying tube is inserted into the pneumatic resistance adjustment tube, the ferrule is coupled and sealed with the tapered portion of the pneumatic resistance adjustment tube, and the humidifying tube fixing nut is screwed into the threads of the pneumatic resistance adjustment tube to fasten the each humidifying tube into the upstream header.

Each of the fastening means for each of humidifying tubes and the upstream header includes: internal threads provided in the upstream header; a first nut for surrounding and fixedly supporting a pneumatic resistance adjustment tube, the first nut having upper and lower nut sections with external threads, a fixing threshold in the periphery of a middle portion, a hole with threads for receiving a headless bolt for one-point support, and a radially tapered lower end; a ferrule for being coupled with the tapered lower end of the first nut; and a second nut for fixing the each humidifying tube, wherein the first nut is inserted into the internal threads of the upstream header, the each humidifying tube is inserted into the lower part of the first nut, and the second nut is coupled to fasten the each humidifying tube into the upstream header.

The fastening means for each of humidifying tubes and the upstream header includes: internal threads provided in the upstream header; a first nut for surrounding and fixedly supporting a pneumatic resistance adjustment tube, the first nut having external threads at the upper end, a fixing threshold in the periphery under the threads, a hole with threads for receiving a headless bolt for one-point support, and a radially tapered lower end; a ferrule for being coupled with the tapered lower end of the first nut; a second nut for fixing the each humidifying tube; and a connector tube having an outer diameter the same as the each humidifying tube and the pneumatic resistance adjustment tube, wherein the first nut is inserted into the internal threads of the upstream header, the connector tube is coupled with the lower part of the first nut to connect the each humidifying tube and the pneumatic resistance adjustment tube, and the connector tube is coupled with the second nut to fasten the each humidifying tube into the upstream header.

Each of the fastening means for each of humidifying tubes and the upstream header includes: internal threads provided in the upstream header; a first nut for surrounding and fixedly supporting a pneumatic resistance adjustment tube, the first nut having external threads provided in the whole periphery, grooves at both sides of a middle portion, a hole with threads for receiving a headless bolt for one-point support, and a radially tapered lower end; a second nut for fixing the first nut; a ferrule for being coupled with the tapered lower end of the first nut; and a third nut for fixing the each humidifying tube, wherein the first nut is inserted into the internal threads of the upstream header, the second nut fixes the first nut to the upstream header, the each humidifying tube is inserted into the lower part of the first nut, and the third nut is coupled to fasten the each humidifying tube into the upstream header.

Each of the fastening means for each of humidifying tubes and the downstream header includes: internal threads provided in the downstream header; a support baffle plate; an opening adjustment plate; a first nut for fixing the support baffle plate and the opening adjustment plate, the first nut having external threads at both ends and a middle portion with reduced inside radius for stopping the each humidifying tube, the support baffle and the opening adjustment plate; and a second nut for fixing a pneumatic resistance adjustment tube, wherein the first nut is coupled into the threads of the downstream header, the baffle plate, the opening adjustment plate and the humidifying tube are inserted into the first nut, and the second nut is coupled around the first nut to fasten the each humidifying tube to the downstream header.

The steam injection humidifier further comprises cylindrical plugs for coupling the humidifying tubes with the upstream and downstream headers to adjust the number of the humidifying tubes in opening/shutting the passages according to required humidifying capacity.

The humidifying tubes may be thimble-type humidifying tubes each having passages therein for allowing steam to make a detour.

Each of the thimble-type humidifying tubes may have a passage-guiding insert having a U-shaped side section or an inside passage-guiding insert having an O-shaped side section within the each thimble-type humidifying tube to form passages so that nonuniformity of a steam state within the each thimble-type humidifying tube is compensated due to cooling by the ambient air to allow the steam state to be substantially uniform.

Each of the thimble-type humidifying tube may have an outer tube, the outer tube generally having a geometric sectional shape selected from a group including a flat shape, ellipse or diamond to reduce resistance against an outer main flow, the outer tube additionally having circularly sectional end shapes where the thimble-type humidifying tubes are fastened to the upstream and downstream headers by ferrules for preventing leakage.

Each of the thimble-type humidifying tube may have an inner passage-guiding insert formed to be outwardly projected in part and humidifying nozzles provided at one side of the inner passage-guiding insert.

A quick response steam generator, comprising: a housing for defining the contour of the steam generator to feed steam to a humidifier and storing water in the lower part; a heater for heating water; a spray nozzle for supplying water; a water drain for exhausting water in the lower part of the housing; a number of absorbers for surrounding the heater, the absorbers being selected from a group including a porous metal structure, a metal mesh and a metal fin, whereby liquid is pumped by capillarity to constantly maintain the upper part of the porous metal structure in a wet state, and the heat transfer area per unit volume between the heater and liquid is enlarged; and a number of gaps arranged in a longitudinal direction for enhancing efficiency of transferring heat from the heater to enhance responsiveness so that bubbles generated by the heater can be easily released.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
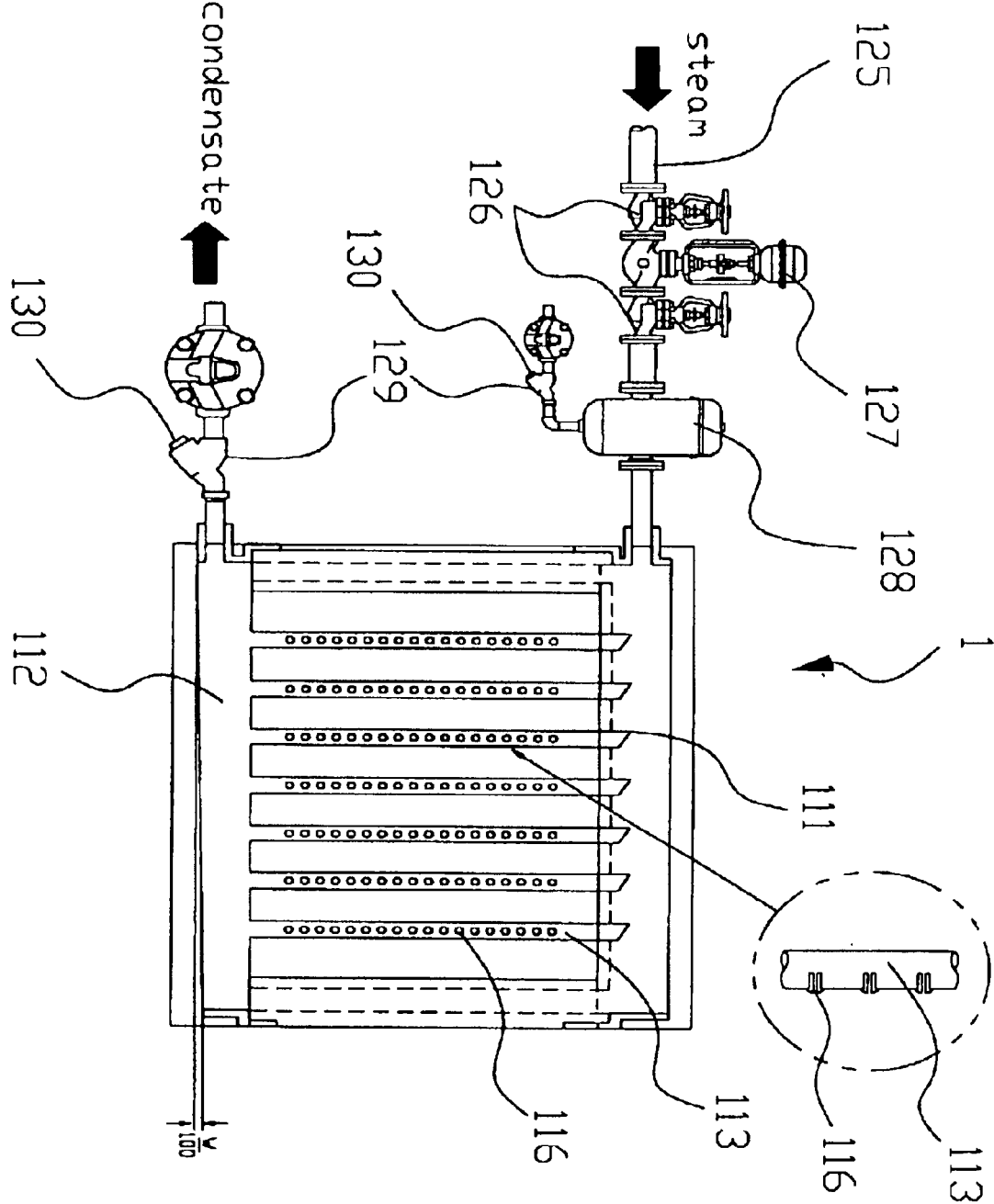
FIG. 1 is a general assembly drawing of a humidifier according to the invention.

Reference now should be made to the drawings, in which the same reference numerals are used throughout the different drawings to designate the same or similar components.

FIG. 1 is a general assembly drawing of a humidifier 1 according to the invention. Steam generated from a steam generator passes through a separator 128 for fractionating liquid via a steam feed pipe 125 to be injected through humidifying tubes 113 of multi-passages via an upstream header 111 and remaining liquid state condensate is returned via a downstream header 112 so as to complete a circulation process.

At both ends of the pressure control valve, stop valves 126 are provided for stopping steam feed in emergency or during maintenance. Strainers 129 are provided at a feed end of steam and a recovery end of condensate to filter impurities. Steam traps 130 are provided at the lower ends of the strainers 129 to exhaust condensate when necessary.

In the humidifying tubes 113 of the humidifier 1 according to the invention, a detachable structure is proposed to the multi-passage humidifying tubes 113 differently from a fixed multi-passage quick response humidification system to enhance flexibility of design according to demand, and a multi-passage design is adopted by the standardized headers so that humidification can be carried out uniformly and load can be adjusted according to humidifying load fluctuation, thereby enhancing flexibility.

In other words, the humidifying tubes 113 are structured of modules and various fastening means 114 are fastened to the upstream header 111 and the downstream header 112 in manufacturing the humidifier 1. If necessary, the humidifying tubes 113 are replaced, the humidifying tube 113 modules are separated, and passages are shut to adjust the number of the passages and thus to adjust steam capacity. Then, load adjustment is enabled through humidification load fluctuation to enhance flexibility of application.

Humidifying nozzles 116 for injecting steam are inserted and inwardly projected into the humidifying tubes 113. Then, even if supplied steam is cooled and condensed when supplied steam is not sufficiently superheated and temperature of the ambient air outside the humidifying tube 113 is considerably low, condensate is downwardly discharged by gravity so as to prevent the condensate from being mixed with and injected together with steam.

Figure 2A:
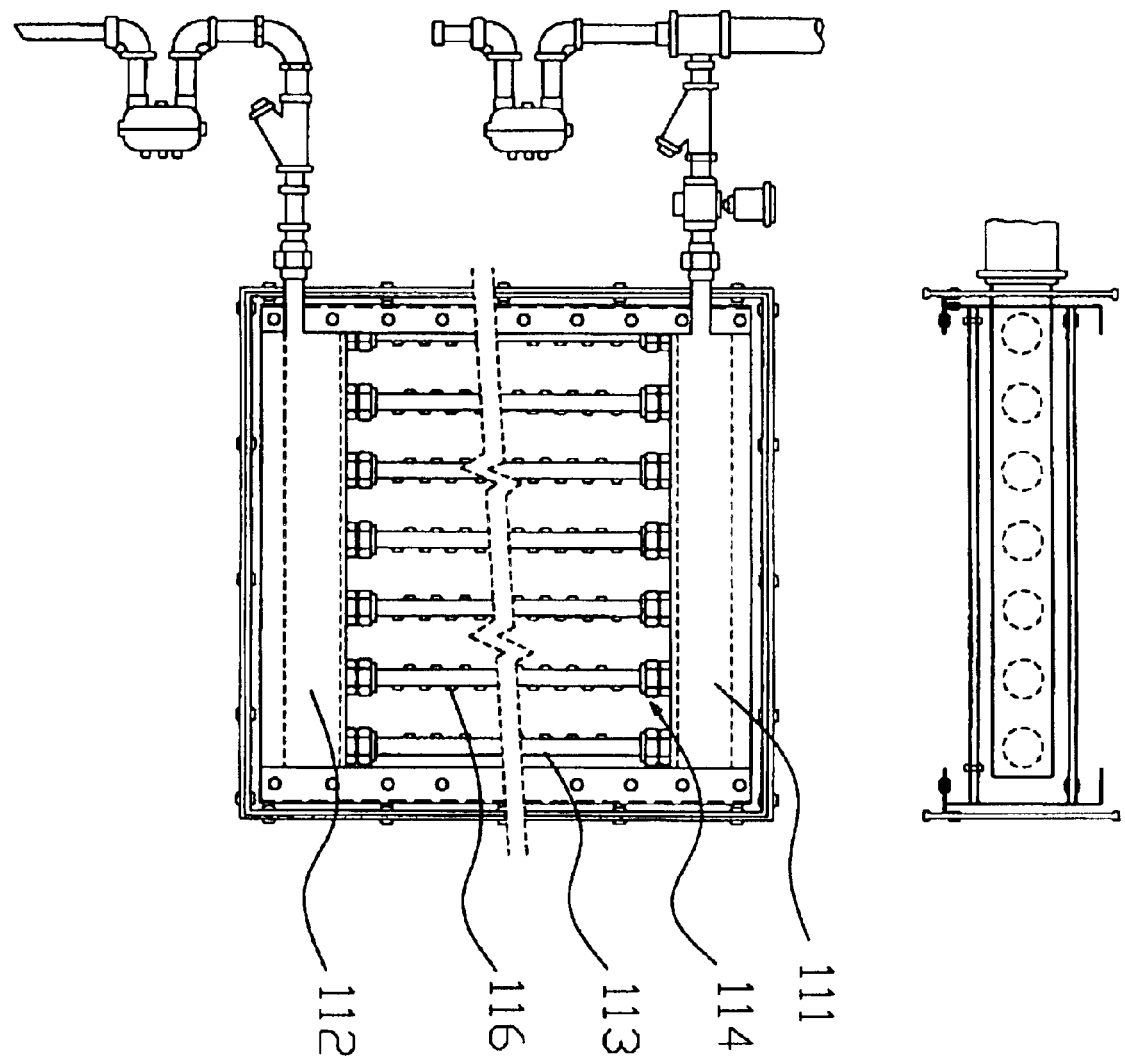
FIG. 2A is a plan assembly drawing for showing humidifying tubes vertically mounted according to the invention.

FIG. 2A is a plan assembly drawing for showing the humidifying tubes 113 vertically mounted according to the invention, in which the humidifying tubes 113 are fastened to the upstream and downstream headers 111 and 112 by the fastening means 114.

Figure 2B:
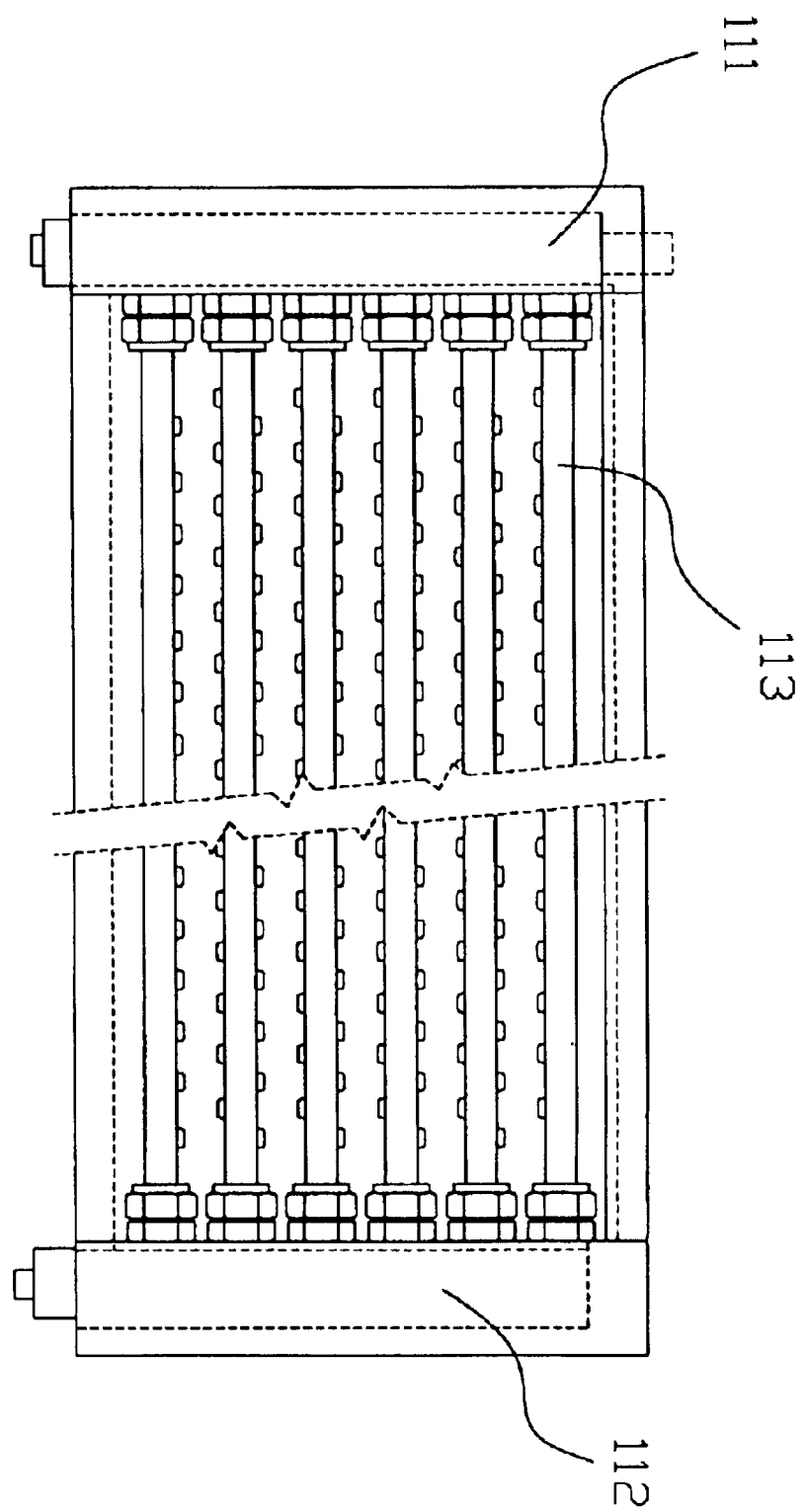
FIG. 2B is a front assembly drawing for showing humidifying tubes horizontally mounted according to the invention.

FIG. 2B is a front assembly drawing for showing the humidifying tubes 113 horizontally mounted according to the invention.

Figure 3:
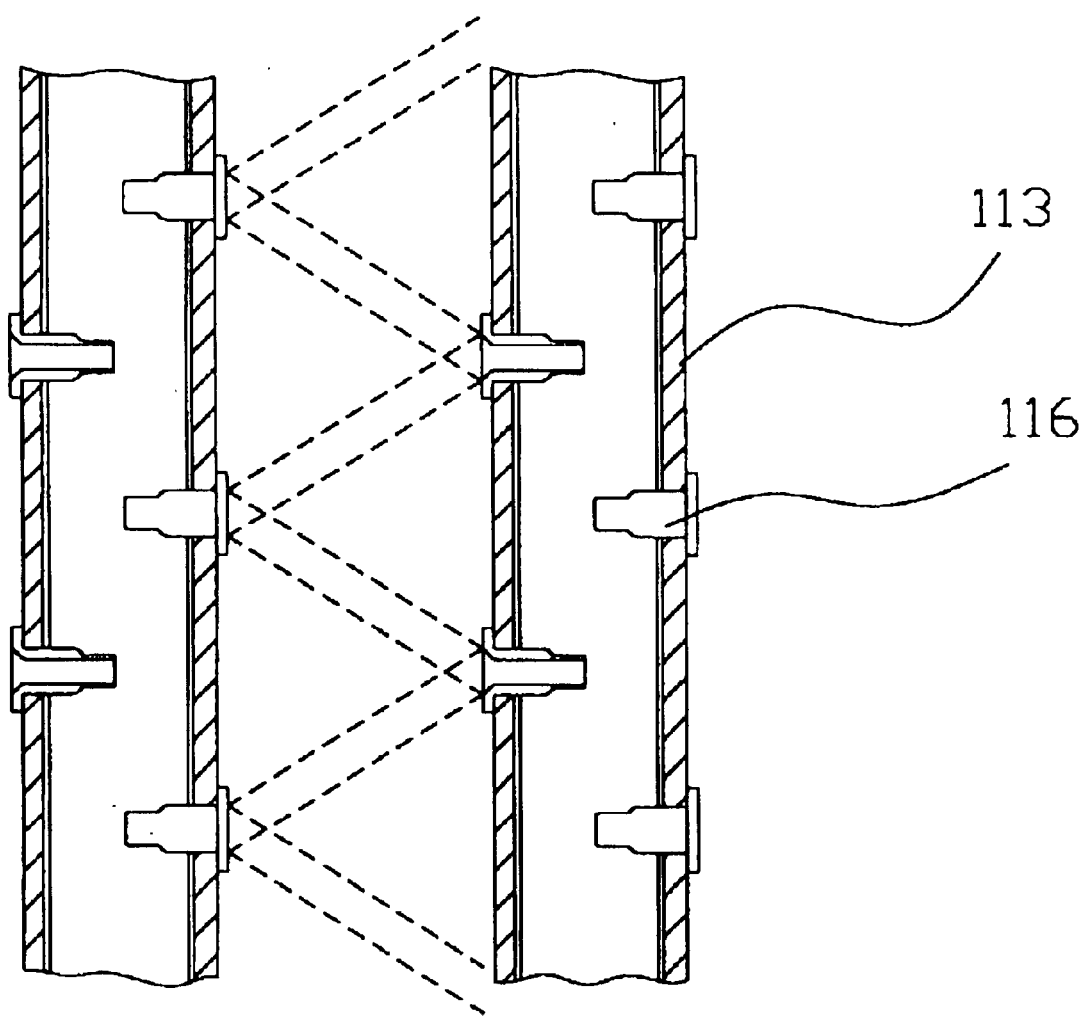
FIG. 3 shows the humidifying nozzles arranged in the humidifying tubes.

FIG. 3 shows the humidifying nozzles 116 arranged in the humidifying tubes 113. When the amount of humidification is large, the humidifying nozzles 116 are installed at both sides of the humidifying tubes 113 to alternate in the adjacent humidifying tubes 113 so that steam can be uniformly injected to passage sections of the ambient air and finely mixed with the air to maintain a more uniform humidification state.

FIG. 4A to FIG. 6B show various fastening means 114 for coupling the humidifying tubes 113 to the headers. A pneumatic resistance adjustment tube 115 is inclinedly cut at the upstream end of each of the humidifying tubes 113. The depth of penetrating the pneumatic resistance adjustment tube 115 into the humidifying tube 113 can be varied to adjust pneumatic resistance from the upstream steam header to the humidifying tube 113 for the uniform distribution of flow rate. The pneumatic resistance adjustment tube 115 is tapered with a suitable cutting angle $\beta$ of $-60°$ to $+60°$. When the inclined surface at its inlet side is rotated, flowing rate of steam into the humidifying tube can be adjusted due to pneumatic resistance.

The other end or the downstream end of the humidifying tube 113 is formed to be right-angled and an opening adjustment plate 124 and a support baffle plate 123 are inserted so that the amount of condensate and steam exhaust can be easily adjusted.

Figure 4A:
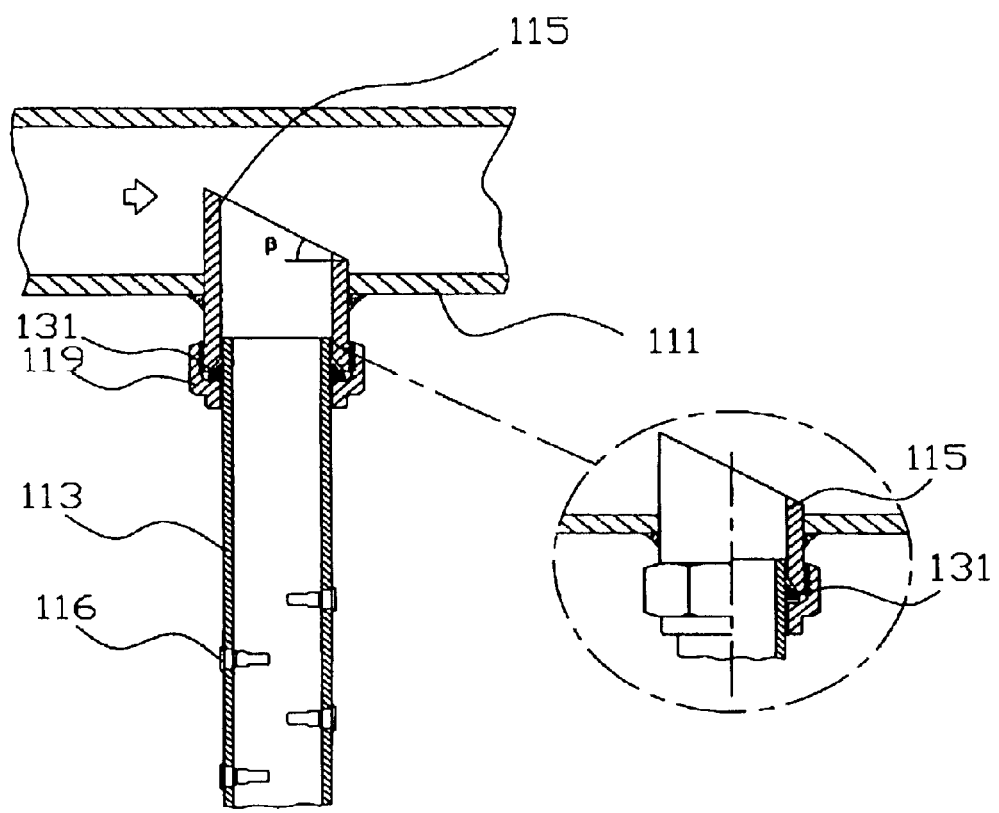
FIG. 4A and FIG. 4B show a front sectional view and a side sectional view when the upstream header and the humidifying tube are coupled.
Figure 4B:
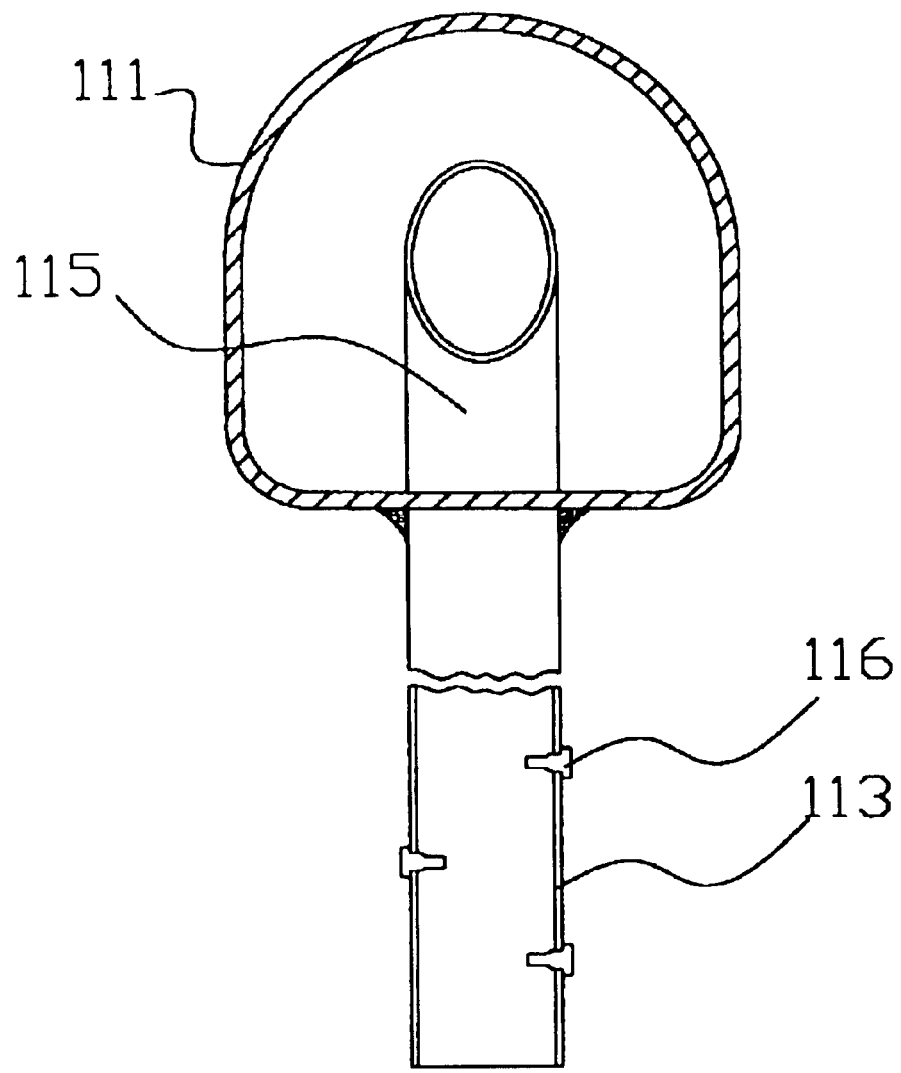

FIG. 4A and FIG. 4B show a front sectional view and a side sectional view when the upstream header 111 and the humidifying tube 113 are coupled. The pneumatic resistance adjustment tube 115 is fixedly welded to the upstream header 111 as the upstream end of the humidifying tube 113. The humidifying tube is fastened into the pneumatic resistance adjustment tube 115, in which the fastening means 114 has external threads formed around the lower part of the pneumatic resistance adjustment tube 115 to be coupled with a nut 119 for fixing the humidifying tube. Here, the fastened pneumatic resistance adjustment tube 115 and humidifying tube 113 are sealed as follows: First, the lower end of the pneumatic resistance adjustment tube 115 is radially tapered. A ferrule 131 inserted into the humidifying tube 113 is pushed into the cutout portion of the pneumatic resistance adjustment tube 115 so that the ferrule 131 is pressed and deformed for sealing. Then, the humidifying tube fixing nut 119 is rotationally coupled with the external threads of the pneumatic resistance adjustment tube 115.

The humidifying tube 113 has an outer diameter substantially the same as that of an inner diameter of the pneumatic resistance adjustment tube 115.

Figure 5:
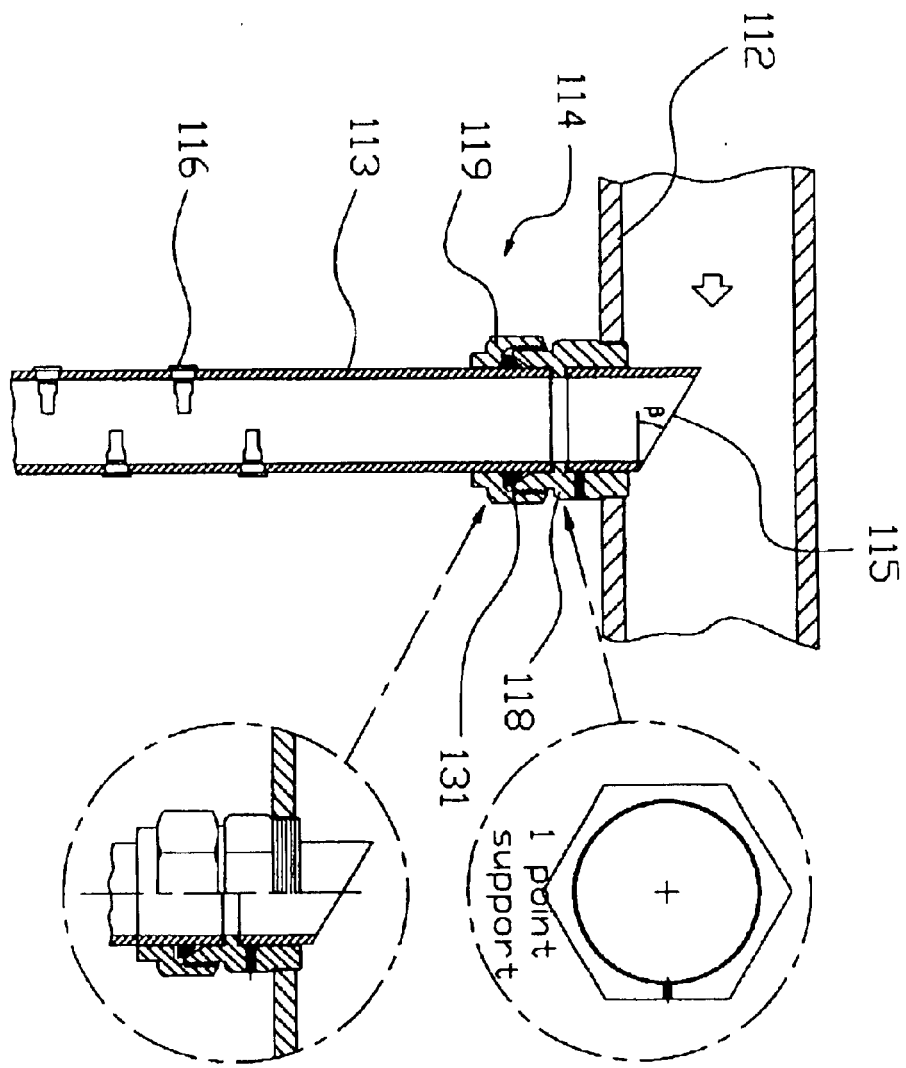
FIG. 5 is a sectional view for showing the upstream header and the humidifying tube coupled with the fastening means according to the invention.

FIG. 5 shows a sectional view and detailed partial sectional views of the upstream header 111 and the humidifying tube 113 coupled with the fastening means 114 according to the invention. The fastening means 114 fixes the pneumatic resistance adjustment tube 115 inserted in the upstream header without welding. The upstream header 111 is provided with a hole having internal threads that can be engaged with a nut. A nut 118 for fixing the pneumatic resistance adjustment tube is inserted into the hole for wrapping and fixedly supporting the pneumatic resistance adjustment tube 115. Then, the humidifying tube 113 is fastened to the lower part of the nut 118 by using the fastening means 114 with the humidifying tube fixing nut 119 as shown in FIG. 4A and FIG. 4B.

The pneumatic resistance adjustment tube fixing nut 118 fixedly inserted into the upstream header 111 is provided with external threads at both outer ends to define an upper nut section and a lower nut section, and fixing threshold is provided in the periphery of the nut 118 so that the lower part of the pneumatic resistance adjustment tube 115 is stopped at the upper part of thereof and the humidifying tube 113 is stopped at the lower part thereof. The nut 118 has a tapered lower end the cutout of which a ferrule 131 is pushed for sealing.

Due to the fixing threshold, the pneumatic resistance adjustment tube 115 is only capable of rotation but incapable of length adjustment in a downward direction. Meanwhile, the height of an upward projection can be adjusted by replacing the pneumatic resistance adjustment tube.

Also, a hole with threads is formed at one side of the upper nut section where a headless bolt is inserted to fix the pneumatic resistance adjustment tube through one-point support.

In the foregoing nut 118, the upper nut section has an outer diameter larger than that of the lower nut section into which the nut of the fastening means 114 as shown in FIG. 4A and FIG. 4B is engaged.

The upper nut section is stopped by the threshold projected at the periphery of the nut 118 to avoid further insertion when fixedly screwed into the upstream header 111.

Hereinbefore, the humidifying tube 113 and the pneumatic resistance adjustment tube 115 have the same outer and inner diameters.

Figure 5A:
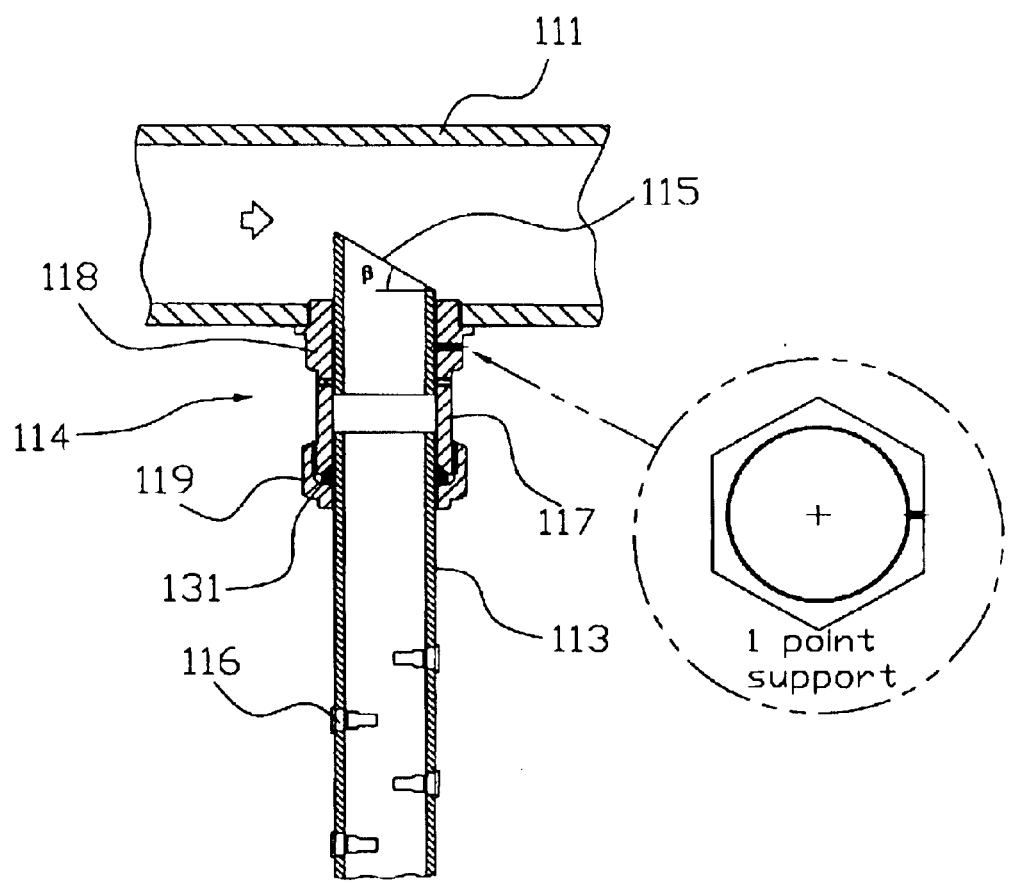
FIG. 5A and FIG. 5B are sectional views for showing the upstream header and the humidifying tube coupled with a replaceable fastening means.
Figure 5B:
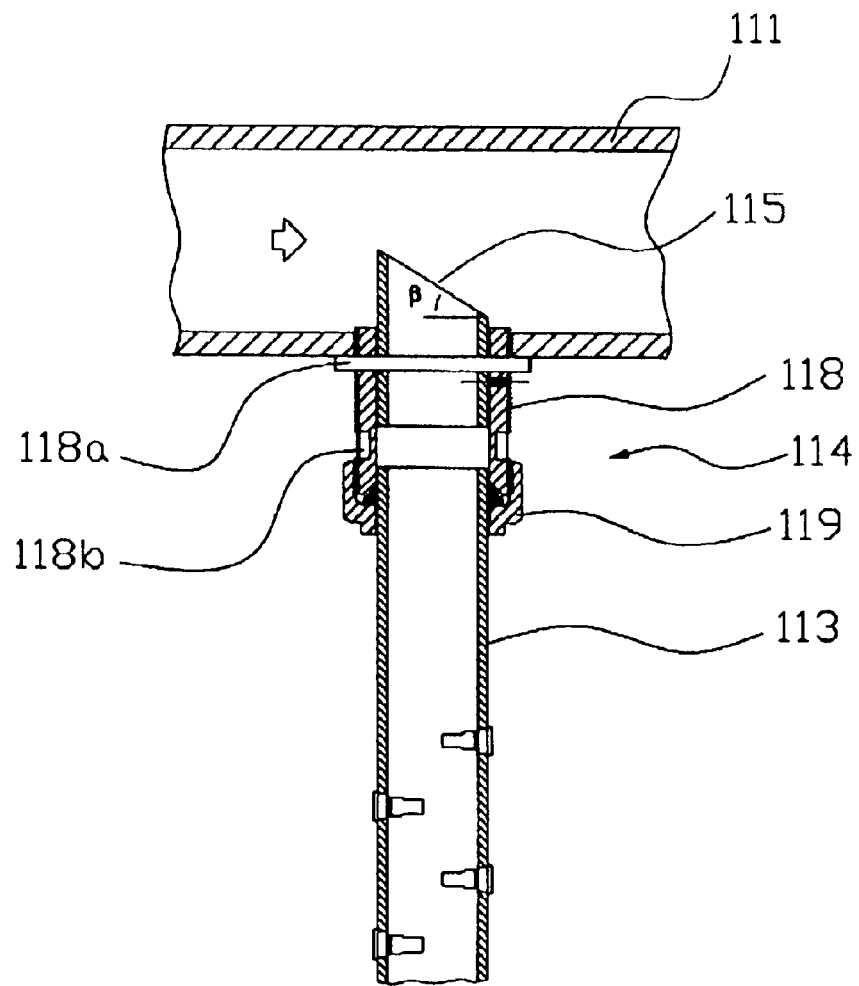

FIG. 5A and FIG. 5B are sectional views and a detailed partial sectional view of the upstream header 111 and the humidifying tube 113 coupled with a replaceable fastening means 114, respectively. Such a screw fastening means 114 is used to enable vertical displacement of the pneumatic resistance adjustment tube, which was not allowed in the structure shown in FIG. 5.

The fastening means has a nut 118 for fixing the pneumatic resistance adjustment tube shown in FIG. 5A which is provided only with the upper nut section without the fixing threshold from the pneumatic resistance adjustment tube fixing nut shown in FIG. 5. Thus, the pneumatic resistance adjustment tube 115 is vertically displaced as far as desired and a headless bolt is inserted into a hole formed at one side of the nut to fix the nut 118 through one-point support.

Also, a connector tube 117 is inserted between the pneumatic resistance adjustment tube 115 and the humidifying tube 113 with an outer diameter the same as those thereof. Then, the length of the pneumatic resistance adjustment tube 115 can be expanded through a space defined by an inner diameter portion.

A nut 119 for fixing the humidifying tube is coupled in the same structure as shown in FIG. 5.

A nut 118 for fixing the pneumatic resistance adjustment tube shown in FIG. 5B is structured differently from the pneumatic resistance adjustment tube fixing nut 118 shown in FIG. 5A. The nut 118 has no fixing threshold for preventing insertion of the nut into the upstream header 111, and threads are formed on the whole periphery thereof. The nut 118 is directly screwed into the humidifying tube fixing nut 119. Thus, the nut itself cannot be inserted into the upstream header 111 and is fixed by an additional nut engaged into the threads.

The pneumatic resistance adjustment tube 115 is provided with a hole at one side as in the nut described above, and regulates displacement of the pneumatic resistance adjustment tube 115 through one-point support by a headless bolt inserted into the hole.

The humidifying tube fixing nut 119 is coupled as shown in FIG. 5.

In FIG. 5A and FIG. 5B, the pneumatic resistance adjustment tube is tapered at its lower end so that the ferrule 131 is inserted for sealing.

Figure 6:
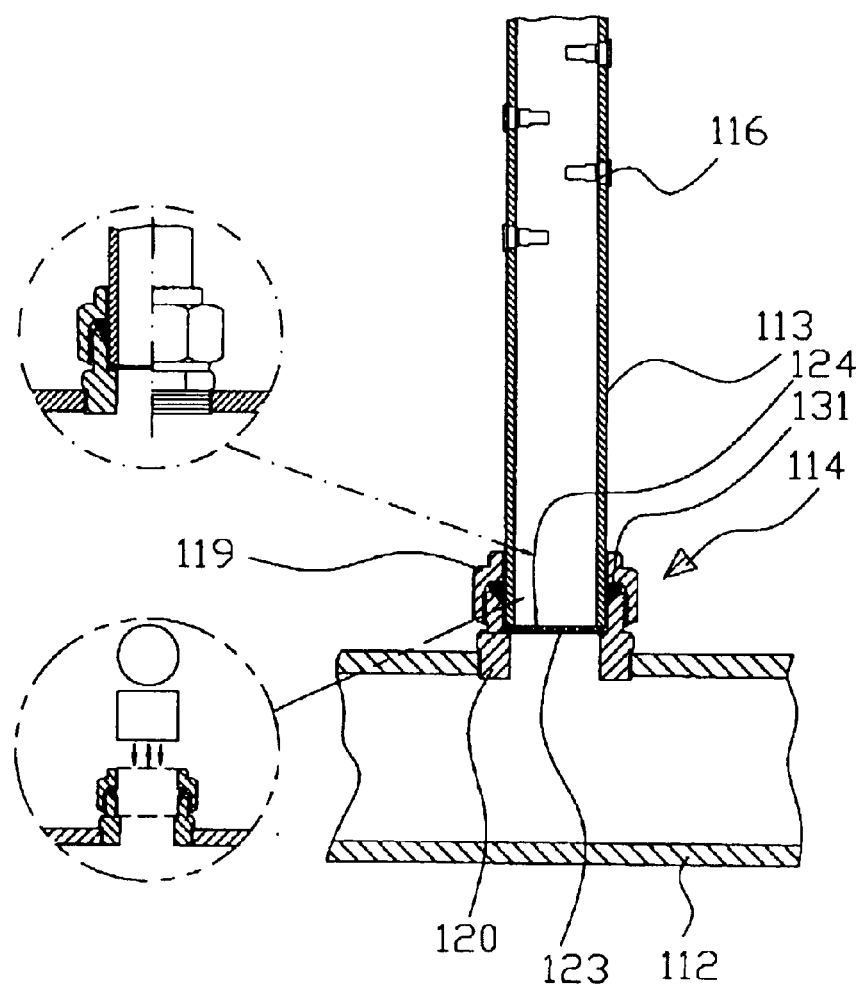
FIG. 6 is a sectional view for showing the downstream header and the humidifying tube coupled with a replaceable fastening means.
Figure 6A:
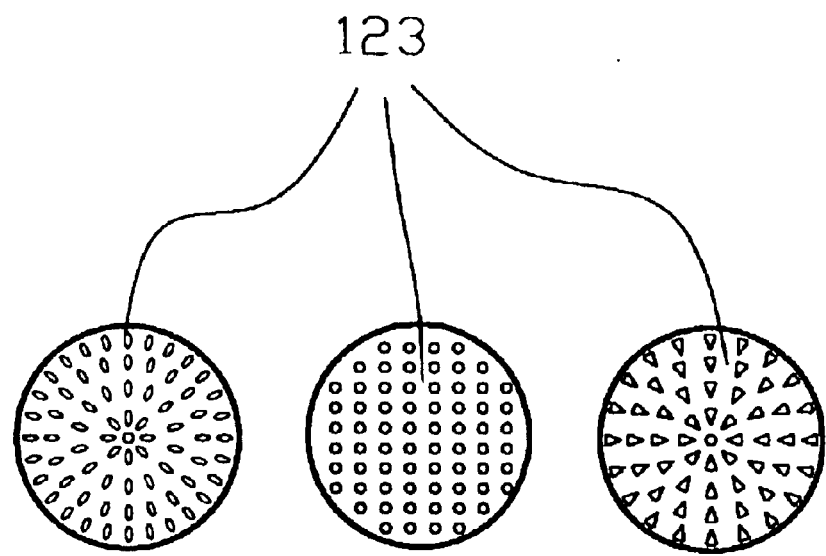
FIG. 6A and FIG. 6B show penetrated/tapered support baffle plates and opening adjustment plates for adjusting humidifying capacity.
Figure 6B:
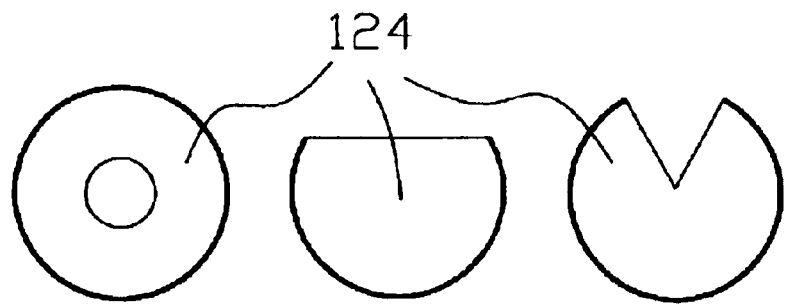

FIG. 6 is a sectional view and detailed partial sectional view for showing the downstream header 112 and the humidifying tube 113 coupled with a replaceable fastening means 114, and FIG. 6A and FIG. 6B show penetrated support baffle plates 123 and opening adjustment plates 124 for adjusting capacity of humidifying steam. The lower end of the humidifying tube 113 is perpendicularly formed and one of the support baffle plates 123 and one of the opening adjustment plates 124 are inserted so that capacity of exhausting steam can be easily adjusted.

In other words, the opening adjustment plate 124 with a condensate exhausting hole and the support baffle plate 123 are installed in sequence between the downstream side of the humidifying tube 113 and the downstream header so that condensate formed in the humidifying tube 113 can pass through the hole in the opening adjustment plate 124 and a number of exhaustion holes of the support baffle plate 123 to flow toward the downstream header. Then exhaustion of condensate can be made easier without degrading humidifying efficiency or capacity of injected steam. The condensate hole in the downstream header side reduces unnecessary waste of steam and effectively exhausts condensate even if the humidifier is horizontally or inclinedly installed as well as vertically installed.

In the screw fastening means 114, a support baffle plate and opening adjustment plate-fixing nut 120 is inserted into the downstream header 112 for fixing the support baffle plate 123 and the opening adjustment plate 124. The support baffle plate and opening adjustment plate-fixing nut 120 is structured to be similar to the pneumatic resistance adjustment tube fixing nut 118 described above. The support baffle plate and opening adjustment plate-fixing nut 120 is provided on its outer upper and lower ends, its inner diameter is decreased in the lower part for holding the humidifying tube 113, the support baffle plate 123 and the opening adjustment plate 124, and its upper end is tapered to allow the ferrule 131 to be pushed into its cutout portion for sealing.

A nut 119 for fixing the humidifying tube in the lower part is structured to be the same as that in the upper part.

The support baffle plates 123 shown in FIG. 6A and the opening adjustment plates 124 shown in FIG. 6B are variously combined as necessary.

As shown, when humidifying load is very small or widely fluctuates due to any reasons including seasonal factors, a cylindrical plug simply replaces the nut where the humidifying tube 113 is inserted to adjust the number of the humidifying tubes 113, thereby adjusting humidifying capacity.

Figure 7A:
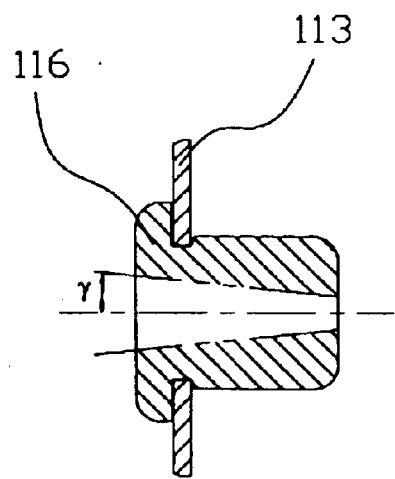
FIG. 7A and FIG. 7B show assembly drawings of the humidifying nozzles and the humidifying tubes of low and high speed according to the invention.
Figure 7B:
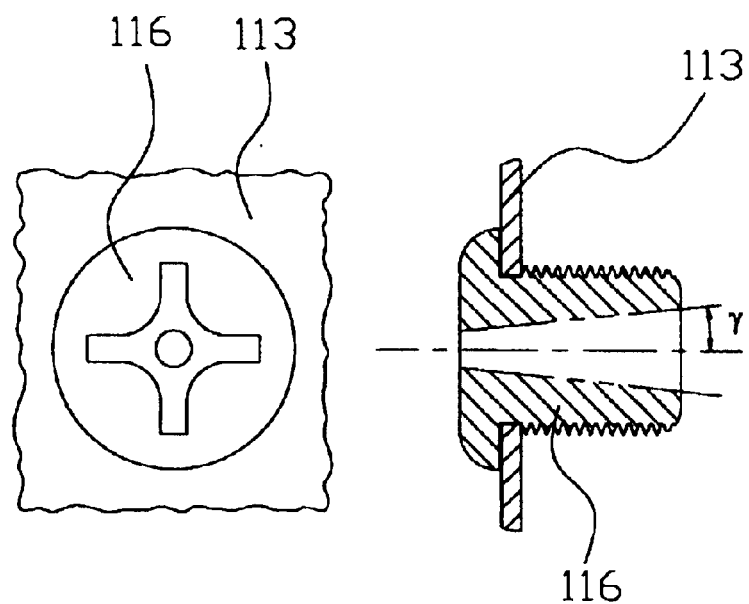

FIG. 7A and FIG. 7B show assembly drawings of the humidifying nozzles 116 and the humidifying tubes 113 of low and high speed according to the invention. Holes of the humidifying nozzles are tapered with a suitable angle of v −60° to +60°, and can be applied as a pressed pin type by using elasto-plastic deformation (FIG. 7A) and a screw type in which a hole is formed in a round-head plus screw (FIG. 7B).

Figure 8:
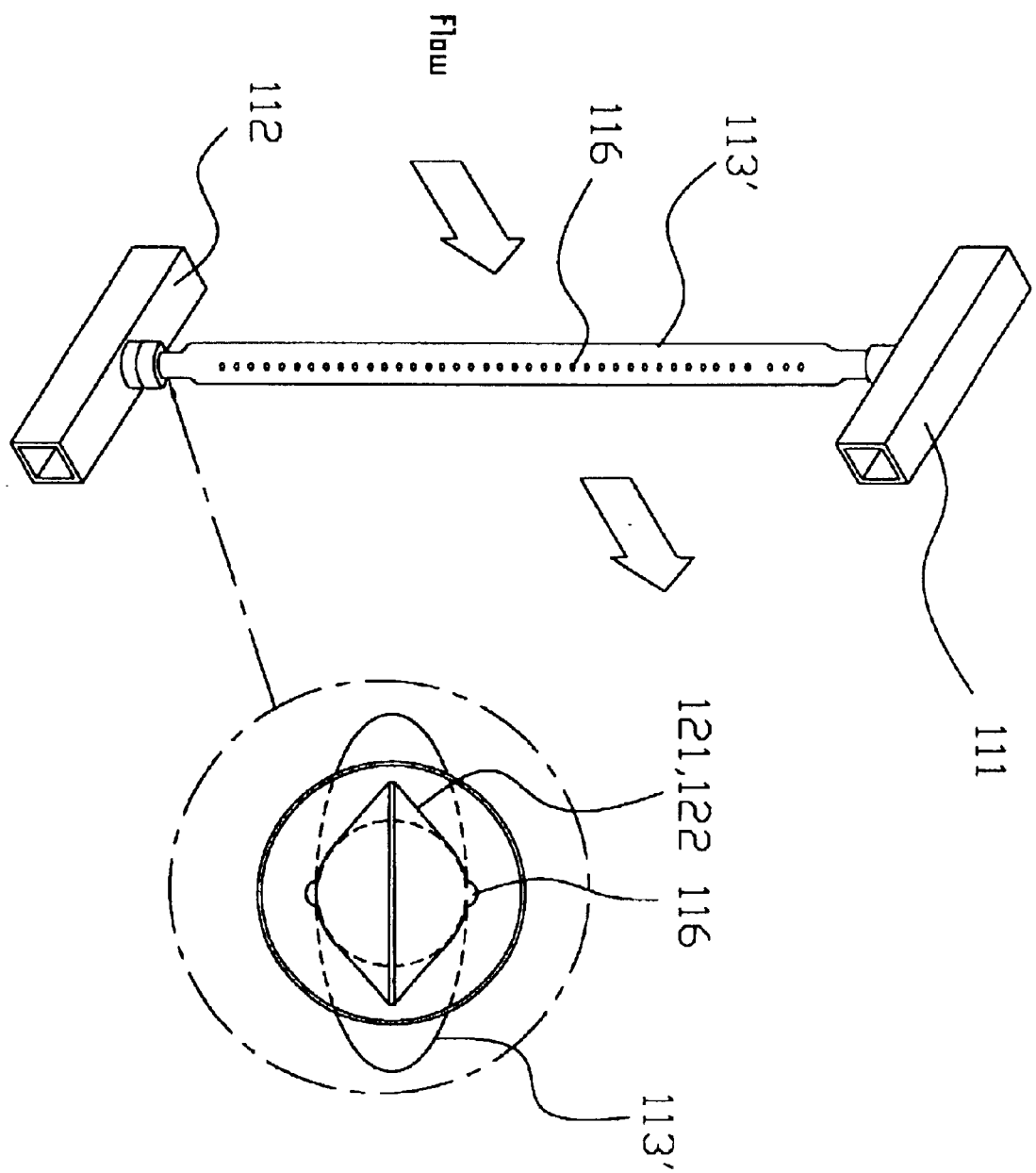
FIG. 8 shows an assembly drawing of the upstream and downstream headers and a thimble-type humidifying tube coupled with a replaceable screw fastening means according to the invention.

FIG. 8 shows an assembly drawing of the upstream and downstream headers 111 and 112 and a thimble-type humidifying tube 113' coupled with a replaceable screw fastening means. The shape of the conventional humidifying tube is changed into various designs including a flat tube, an elliptical tube and the like capable of reducing resistance against ambient air flow, and a passage-guiding insert 121 having a U-shaped side section or an inside passage-guiding insert 122 having an O-shaped side section is inserted into the humidifying tube to obtain a thimble tube structure. Then, a steam passage is obtained in which steam that was non-uniformly cooled by the ambient air is partially heated in a bypass path so that the state of steam injected from the thimble tube becomes substantially uniform, thereby enabling uniform humidification.

Due to the direction of the steam passage, descended steam changes its flowing direction at the support baffle plate 123 and the opening adjustment plate 124 installed as described above, and only steam can be exhausted from the humidifying nozzles installed in the thimble-type humidifying tube 113'.

Condensate condensed within the thimble-type humidifying tube flows toward the downstream header due to gravity.

Due to combination of the support baffle plate 123 and the opening adjustment plate 124, the rate of steam injection according to pressure drop can be adjusted. Thus, the unnecessary waste of steam can prevented, so that an economic operation and an operation in response to various conditions can be achieved.

If the humidifying tube is shaped into a single tube structure instead of the thimble-type humidifying tube 113', heat transfer between the humidifying tube 113 and the ambient air makes the state of the internal steam nonuniform causing performance degradation of the humidifier 1. Also, the amount of injected steam can be nonuniform due to the variation of steam pressure.

Here, it should be observed that the greater part of the tube has an outer shape capable of reducing resistance against main outer flow, whereas both end portions of the tube are shaped round and fitted with the upstream and downstream headers by the ferrules to prevent leakage.

Figure 9:
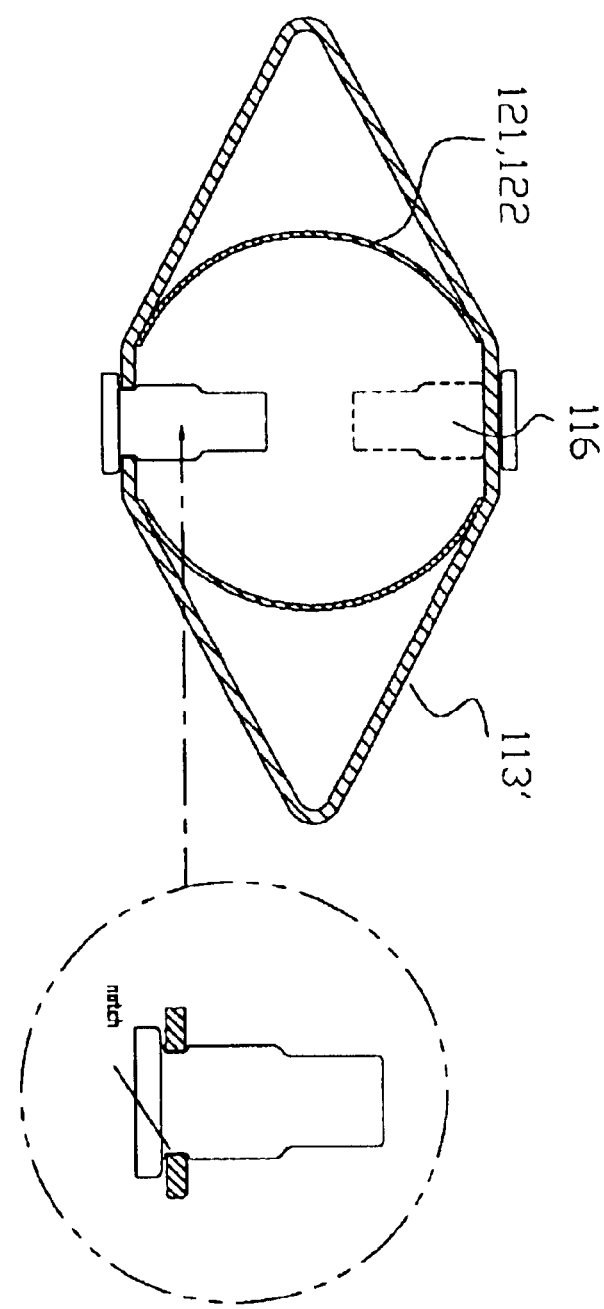
FIG. 9 shows an assembly drawing of the thimble tube and the nozzle according to the invention.

FIG. 9 shows an assembly drawing of the thimble tube and the nozzle. Various structures of such thimble tubes are shown in FIG. 10a to FIG. 11.

Figure 10A:
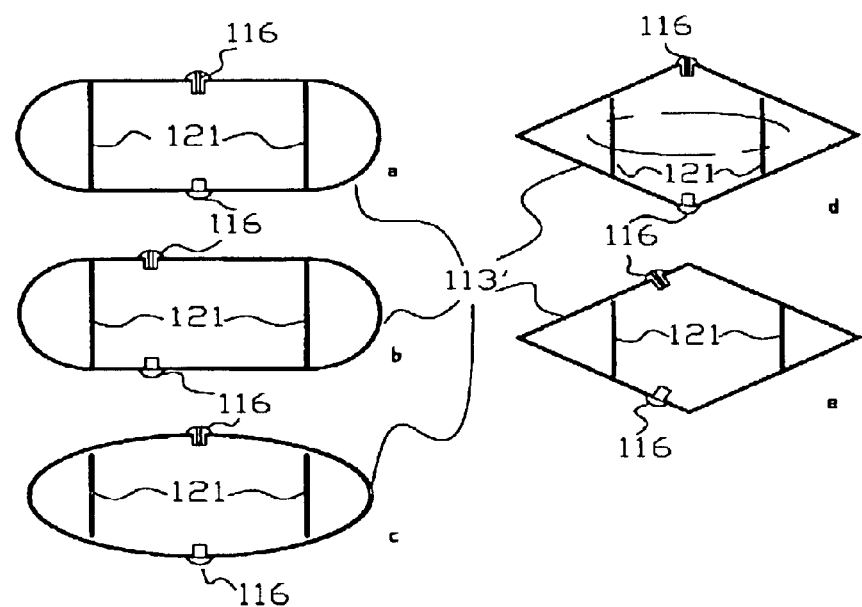
FIG. 10A shows the thimble-type humidifying tubes with cross sections including a flat tube, an elliptical tube, a diamond tube and the like according to the invention.
Figure 10B:
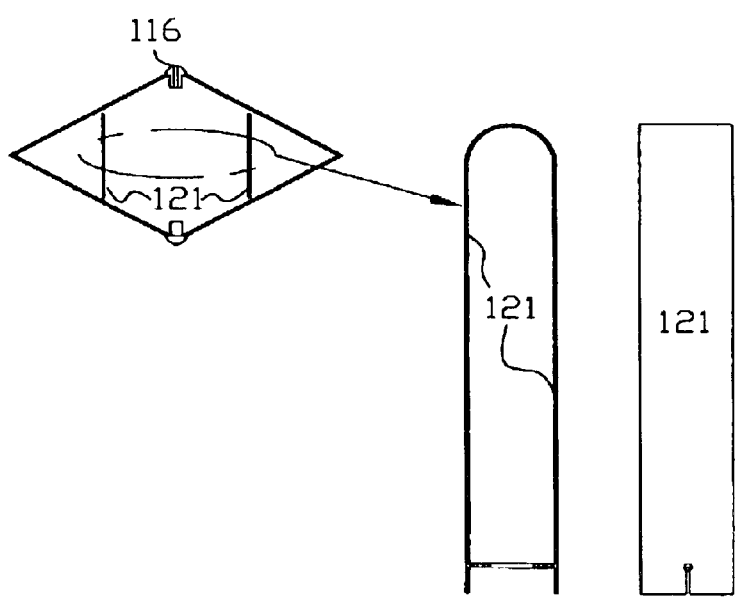
FIG. 10B shows an insert having a U-shaped section to be inserted into the various thimble-type humidifying tubes shown in FIG. 10A according to the invention.
Figure 11:
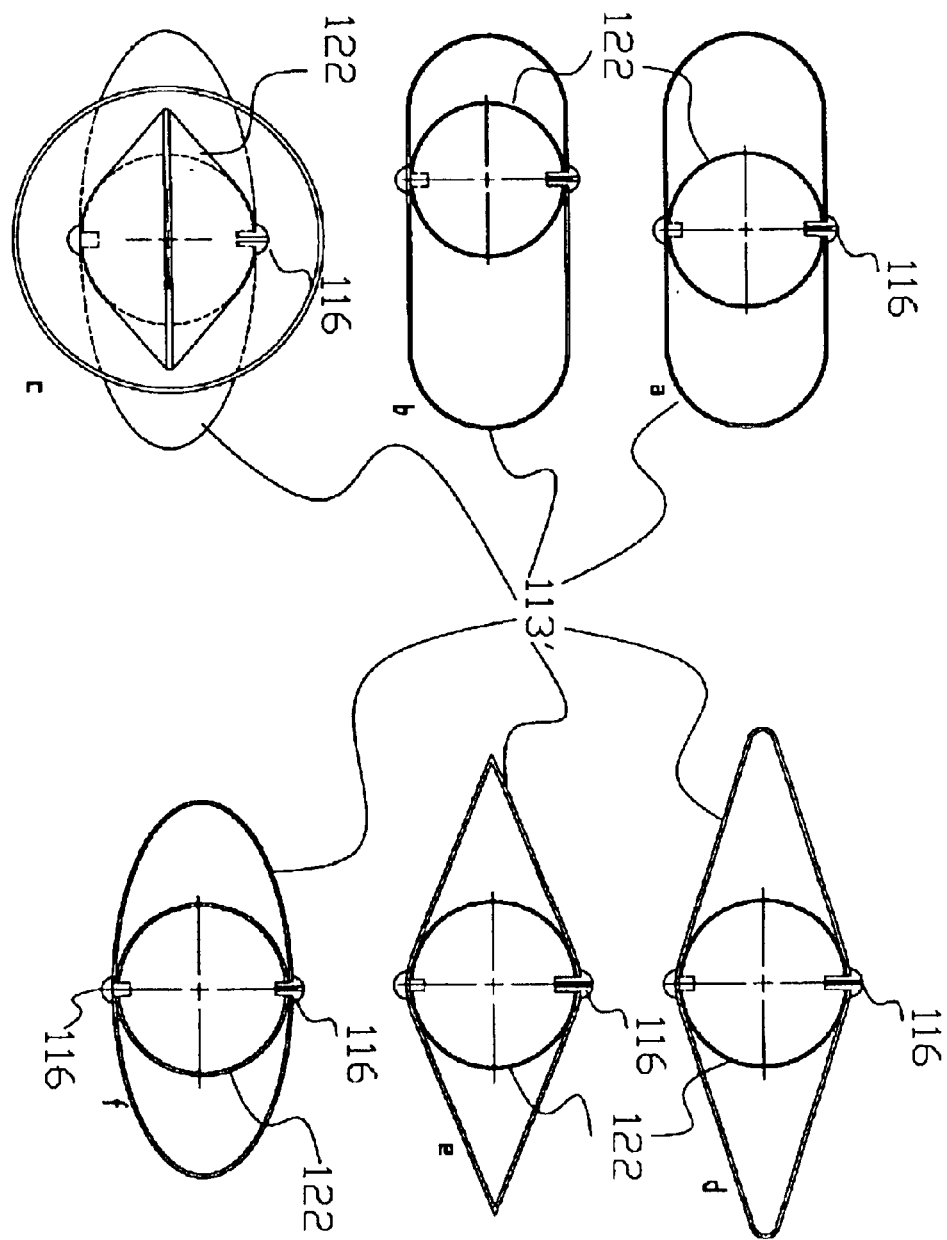
FIG. 11 shows the thimble-type humidifying tubes with cross sections including a flat tube, an elliptical tube, a diamond tube and the like according to the invention, in which an insert for guiding an inner passage having an O-shaped cross section is inserted.

FIG. 10A shows the thimble-type humidifying tubes with cross sections including a flat tube, an elliptical tube, a diamond tube and the like. FIG. 10B shows the passage-guiding insert 121 having a U-shaped longitudinal section which is inserted into the tubes.

The insert is blinded at the upper end so that steam from the upstream header is not directly fed to the injection nozzles. First, steam descends to the lower part of the insert and then ascends again though an opened portion of the insert to be injected through the injection nozzles.

As the flowing direction of steam is changed as above, uniformity of the steam state injected to both sides can be enhanced.

FIG. 11 shows the thimble-type humidifying tubes with cross sections including a flat tube, an elliptical tube, a diamond tube and the like in which an inner passage-guiding insert 122 having an O-shaped cross section is inserted. The insert is blinded at the upper end so that steam from the upstream header is not directly fed to the injection nozzles. First, steam descends to the lower part of the insert and then ascends again though an opened portion of the insert to be injected through the injection nozzles. Here, the upper part of the cylinder is sealed through welding and the like by using a disk and the like. Alternatively, as shown in c of FIG. 11, the upper part of the insert is flattened and then sealed without using an additional member to reduce cost. As the smaller diameter of tube is inserted into the outer tube to obtain the thimble tube and change the direction of steam, uniformity of the steam state can be enhanced.

Figure 12:
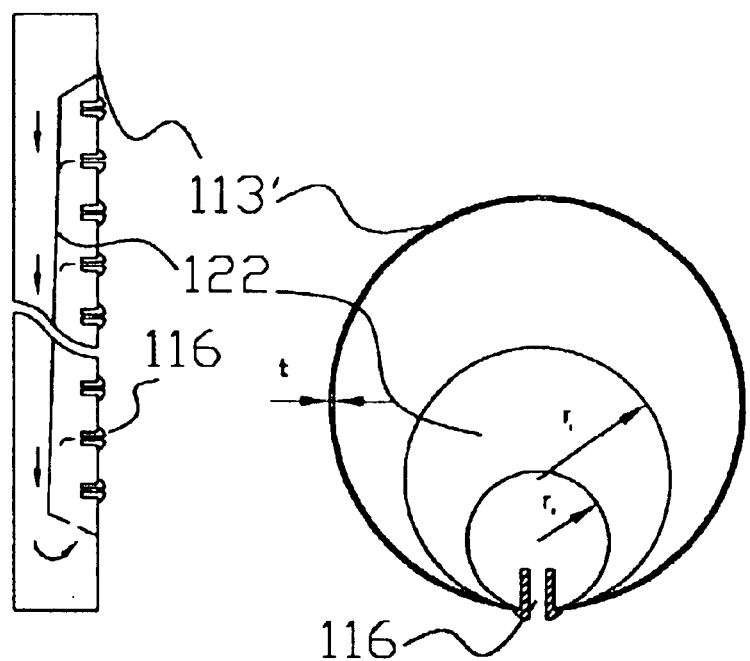
FIG. 12 shows an inner structure of a replaceable thimble-type humidifying tube having little pneumatic pressure loss according to the invention.
Figure 13A:
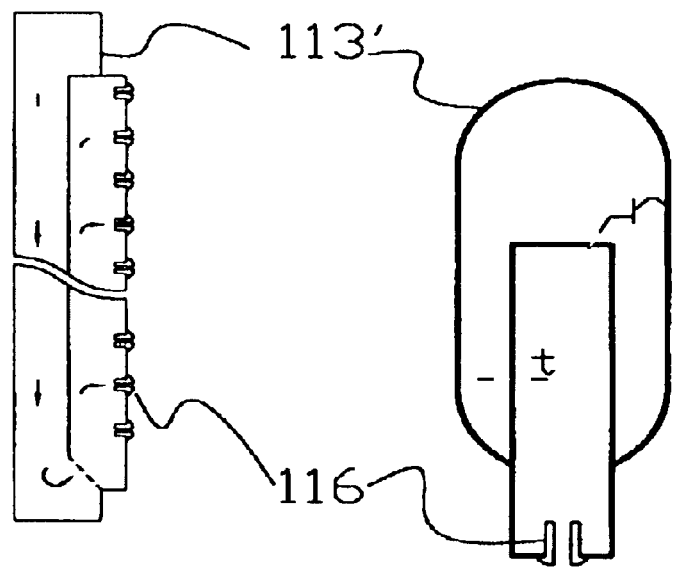
FIG. 13A and FIG. 13B show inner structures of replaceable thimble-type humidifying tubes having little pneumatic pressure loss according to the invention.
Figure 13B:
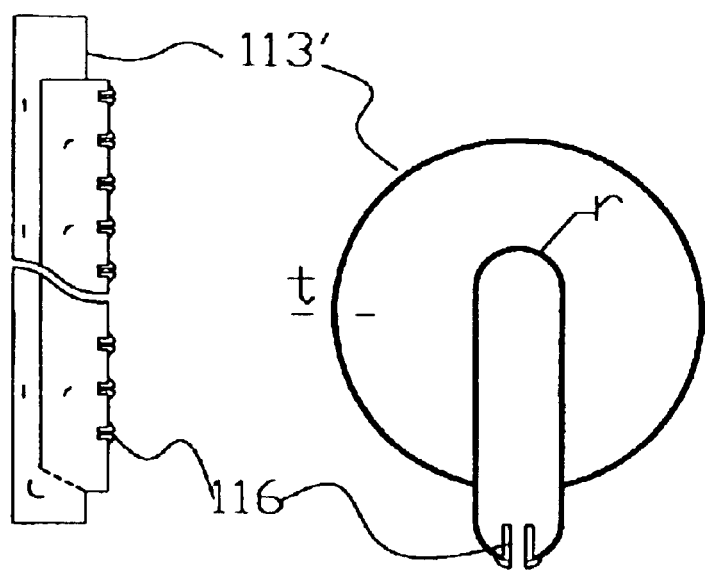
Figure 14A:
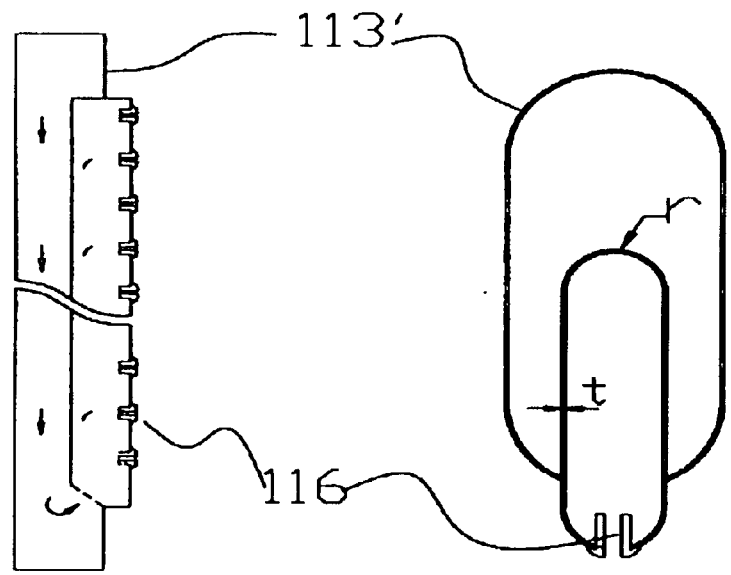
FIG. 14A and FIG. 14B show inner structures of replaceable thimble-type humidifying tubes having little pneumatic pressure loss according to the invention.
Figure 14B:
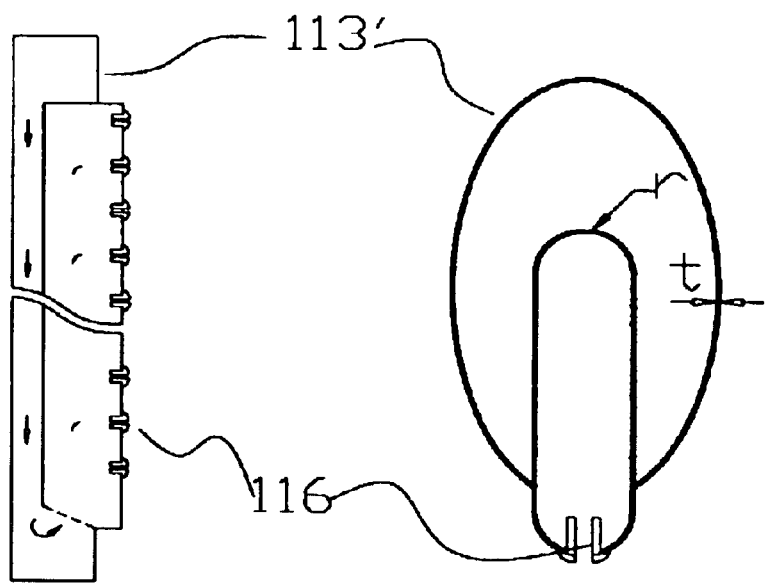

FIG. 12 shows an inner structure of a replaceable thimble-type humidifying tube having little pneumatic pressure loss. A truncated conical tube having a relatively small upper diameter and a relatively large lower diameter is inserted into the thimble-type humidifying tube with its upper end surface blocked, its lower end surface slightly opened and the upper and lower surfaces tapered.

FIG. 13A to FIG. 14B show inner structures of replaceable thimble-type humidifying tubes having little pneumatic pressure loss. Inserts to the humidifying tubes are outwardly projected, and the humidifying nozzles are formed only in the inserts to reduce cost.

According to FIG. 12 to FIG. 14B, the humidifying nozzles 116 are installed only in one side of the tubes to define the thimble-type humidifying tubes 113' and change the direction of steam flow so that uniformity of steam state injected to one side can be enhanced.

Figure 15A:
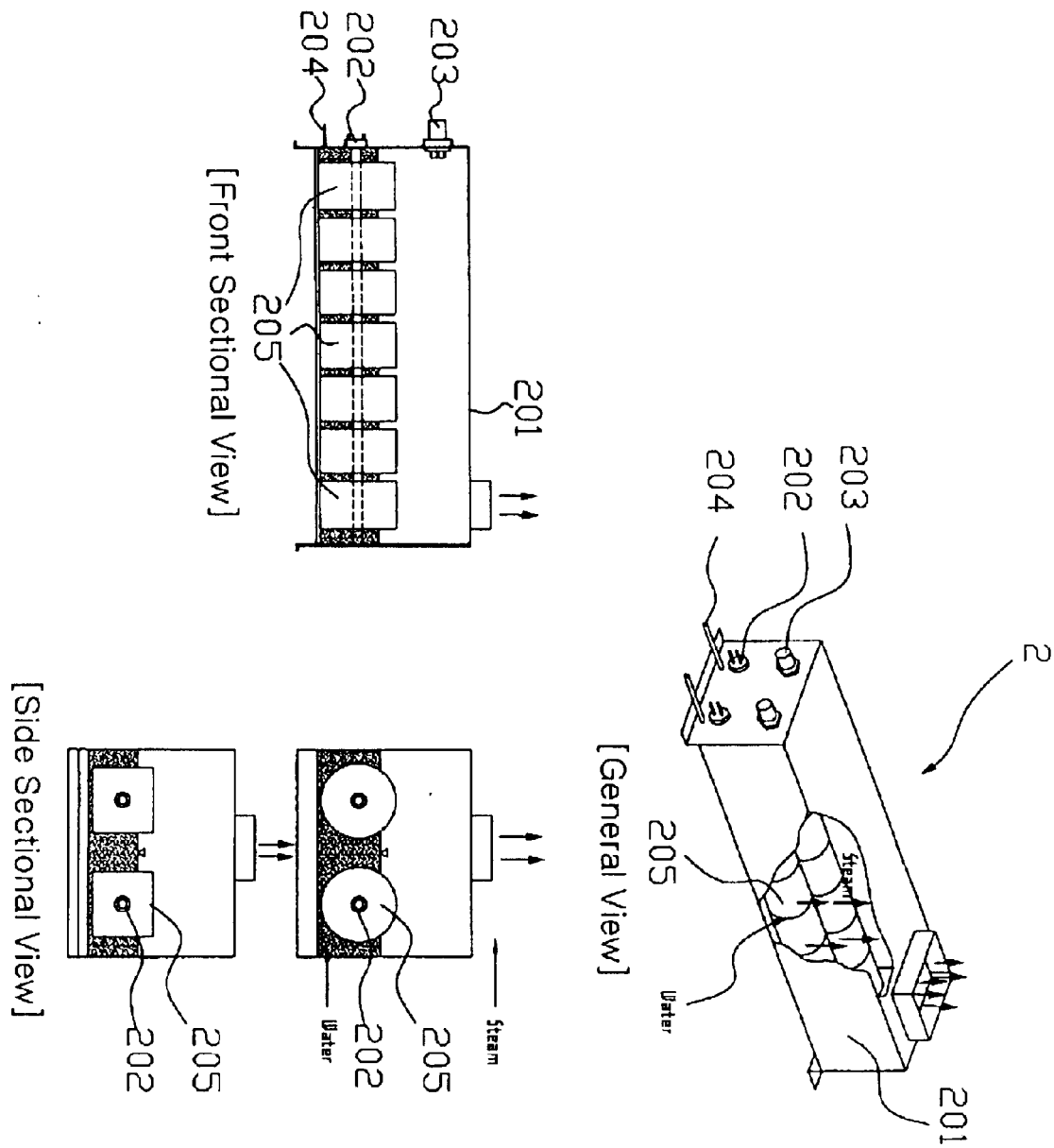
FIG. 15A and FIG. 15B show quick response steam generators according to the invention.
Figure 15B:
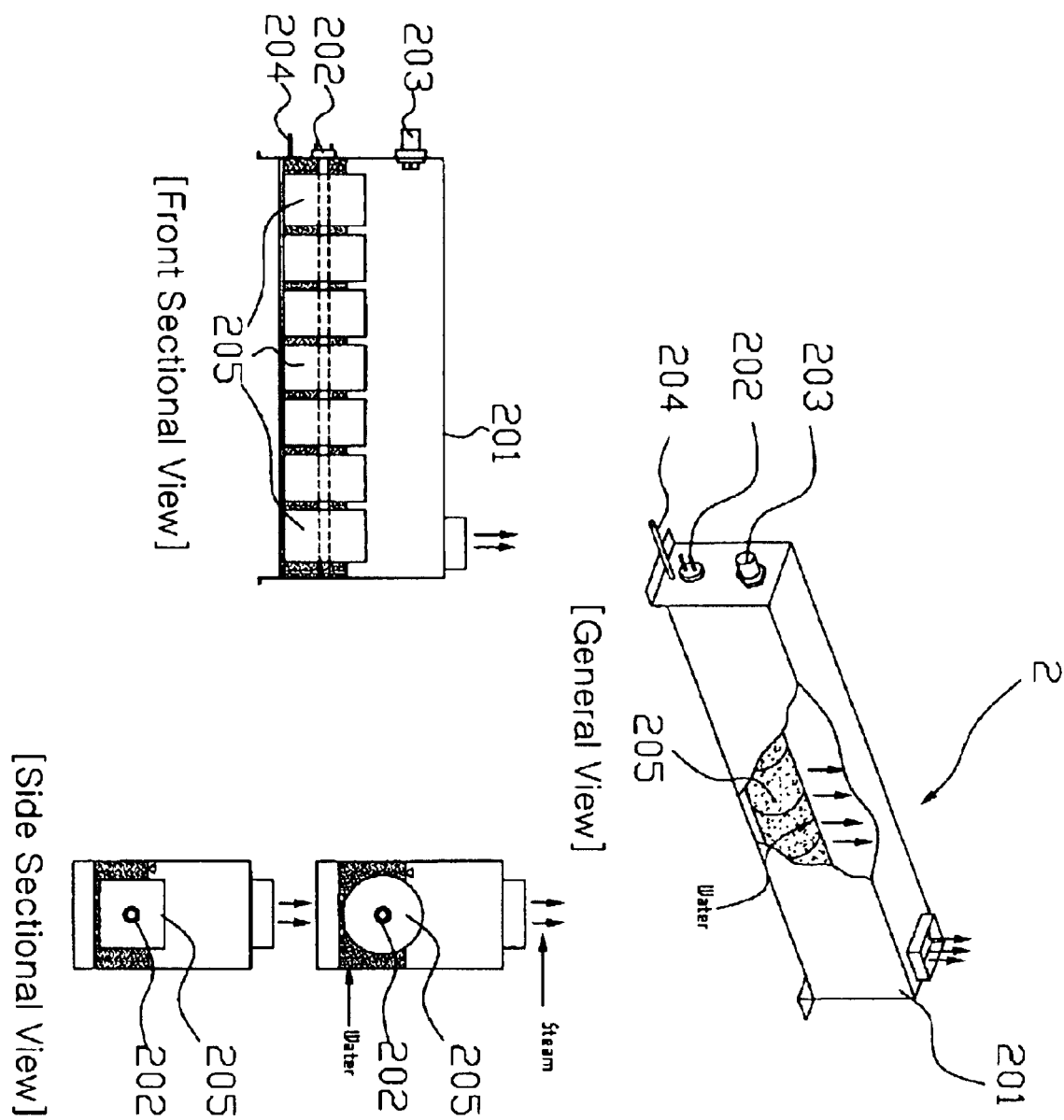

FIG. 15A and FIG. 15B show quick response steam generators 2 according to the invention.

The steam generator 2 is comprised of a housing 201 for defining the contour of the steam generator 2 for feeding steam to the humidifier 1 and storing water in the lower part, heaters 202 for heating water, spray nozzles 203 for supplying water and water drains 204 for exhausting water in the lower part of the housing 201. In order to obtain the high response steam generator which is highly responsive to necessary humidification load fluctuation, different from an impregnated wet heater generally used in a pan-type humidifier, absorbers 205 are provided at the outside of the heaters to surround the heaters with porous metal structures, metal meshes or metal fins and thus the heat transfer area per unit volume is very small, and water level is determined between the heaters and the upper part of the porous metal structures.

A desirable number of absorbers can be provided in the heaters to surround the heaters.

Also, the spray nozzles, the heaters and the water drains can be used in parallel in plural numbers as necessary to construct the system.

The absorbers 205 have a sectional shape which can varied in a number of shapes such as circle, rectangle and the like.

Therefore, liquid is pumped via capillarity so that the upper part of the porous metal structure constantly maintains a wet state, and a large heat transfer area is provided between the heaters and liquid.

Also, there are provided a number of gaps arranged in a longitudinal direction for enhancing efficiency of transferring heat from the heater to enhance responsiveness. Then, bubbles generated from the heater can be easily released thereby enhancing responsiveness to control heating load.

As described hereinbefore, according to the steam injection thimble-type humidifier with the multi-passages and the quick response steam generating system of the invention, the number of the humidifying tubes or the thimble-type humidifying tubes is adjusted to allow adjustment within a wide range of humidifying capacity. The number of the nozzles installed in the humidifying tubes or the thimble-type humidifying tubes is adjusted to allow adjustment within a small range of humidifying capacity. The state of injected steam is made uniform by the inserts installed in the humidifier to enable uniform humidification. Also, the invention can be adopted to clean rooms and humidification apparatuses for a semiconductor manufacturing process to enhance productivity through reduction of absorbing length and improvement of humidification efficiency also.

Further, high response steam feed can be obtained from the steam generator as soon as humidification is necessary.

Although the preferred embodiments of the present invention have been disclosed for illustrative purposes, those skilled in the art will appreciate that the invention is not restricted to the foregoing specific embodiments and various modifications, additions and substitutions can be made without departing from the scope and spirit of the invention as disclosed in the accompanying claims.

What is claimed is:

1. A thimble-type steam injection humidifier in a high response humidification system, the steam injection humidifier comprising:

a number of humidifying tubes structured of multi-passage modules, wherein flexibility of application can be enhanced according to humidifying capacity required for the high response humidification system;

headers arranged upstream and downstream of the humidifying tubes;

detachable fastening means for fastening the humidifying tubes with the upstream and downstream headers, wherein the passages can be opened/shut according to humidifying capacity;

humidifying nozzles uniformly arranged in an air flowing duct, wherein the humidifying tubes are formed to have a geometric sectional shape selected from a group including flat tube, ellipse and diamond to reduce resistance against an air flow;

wherein each of the humidifying tubes comprises a pneumatic resistance adjustment tube projected to the upstream and downstream headers to allow adjustment of steam capacity introduced to the each humidifying tube, and wherein the each humidifying tube is rotatable to adjust the direction of injecting steam and the number of humidifying holes of the humidifying nozzles; and wherein the humidifying nozzles in the each humidifying tube can be detached and replaced with sealing bodies to allow adjustment of the number of the humidifying holes.

2. A thimble-type steam injection humidifier in a high response humidification system, the steam injection humidifier comprising:

a number of humidifying tubes structured of multi-passage modules, wherein flexibility of application can be enhanced according to humidifying capacity required for the high response humidification system;

headers arranged upstream and downstream of the humidifying tubes;

detachable fastening means for fastening the humidifying tubes with the upstream and downstream headers, wherein the passages can be opened/shut according to humidifying capacity;

humidifying nozzles uniformly arranged in an air flowing duct, wherein the humidifying tubes are formed to have a geometric sectional shape selected from a group including flat tube, ellipse and diamond to reduce resistance against an air flow;

wherein each of the humidifying tubes comprises a pneumatic resistance adjustment tube projected to the upstream and downstream headers to allow adjustment of steam capacity introduced to the each humidifying tube, and wherein the each humidifying tube is rotatable to adjust the direction of injecting steam and the number of humidifying holes of the humidifying nozzles; and wherein one of the pneumatic resistance adjustment tubes of the each humidifying tube projected to the upstream header has variable penetrating depth into the upstream header to adjust pneumatic resistance to the each humidifying tube from the upstream header to the each humidifying tube for the uniform distribution of flow rate, and tapered in the upper part, wherein flowing rate of steam into the each humidifying tube at the inlet side can be adjusted by the rotation of the tapered surface.

3. The steam injection humidifier according to claim 2, wherein the tapered upper surface of the one pneumatic resistance adjustment tube has an angle $\beta$ of $-60°$ to $+60°$.

4. A thimble-type steam injection humidifier, in a high response humidification system, the steam injection humidifier comprising:

a number of humidifying tubes structured of multi-passage modules, wherein flexibility of application can be enhanced according to humidifying capacity required for the high response humidification system;

headers arranged upstream and downstream of the humidifying tubes; and detachable fastening means for fastening the humidifying tubes with the upstream and downstream headers, wherein the passages can be opened/shut according to humidifying capacity, wherein each of the fastening means of each of humidifying tubes and the upstream header includes:

internal threads provided in the upstream header;

a first nut for surrounding and fixedly supporting a pneumatic resistance adjustment tube, the first nut having external threads at the upper end, a fixing threshold in the periphery under the threads, a hole with threads for receiving a headless bolt for one-point support, and a radially tapered lower end;

a ferrule for being coupled with the tapered lower end of the first nut;

a second nut for fixing the each humidifying tube; and a connector tube having an outer diameter the same as the each humidifying tube and the pneumatic resistance adjustment tube, wherein the first nut is inserted into the internal threads of the upstream header, the connector tube is coupled with the lower part of the first nut to connect the each humidifying tube and the pneumatic resistance adjustment tube, and the connector tube is coupled with the second nut to fasten the each humidifying tube into the upstream header.

* * * * *

UNITED STATES PATENT AND TRADEMARK OFFICE
CERTIFICATE OF CORRECTION

PATENT NO. : 6,824,127 B2
DATED : November 30, 2004
INVENTOR(S) : Park et al.

It is certified that error appears in the above-identified patent and that said Letters Patent is hereby corrected as shown below:

<u>Title page,</u>
Item [73], Assignee, should read as follows:
-- Korea Institute of Machinery & Materials, Daejeon-si (KR) --

Signed and Sealed this

Fifteenth Day of March, 2005

JON W. DUDAS
*Director of the United States Patent and Trademark Office*